United States Patent [19]
Roff

[11] Patent Number: 5,937,124
[45] Date of Patent: Aug. 10, 1999

[54] PACKAGE FOR AN OPTOELECTRONIC DEVICE

[75] Inventor: Robert Wallace Roff, Westfield, N.J.

[73] Assignee: The Whitaker Corporation, Wilmington, Del.

[21] Appl. No.: 08/890,535

[22] Filed: Jul. 9, 1997

Related U.S. Application Data

[62] Division of application No. 08/665,072, Jun. 11, 1996, Pat. No. 5,692,084
[60] Provisional application No. 60/012,531, Feb. 29, 1996.

[51] Int. Cl.⁶ .................................................. G02B 6/36
[52] U.S. Cl. ................................. 385/88; 385/92; 385/94
[58] Field of Search ......................................... 385/88–94

[56] References Cited

U.S. PATENT DOCUMENTS

| | | | |
|---|---|---|---|
| 4,210,923 | 7/1980 | North et al. | 357/30 |
| 4,729,623 | 3/1988 | Mery | 350/96.2 |
| 4,818,056 | 4/1989 | Enochs et al. | 350/96.2 |
| 4,897,711 | 1/1990 | Blonder et al. | 357/74 |
| 4,961,053 | 10/1990 | Krug | 324/158 R |
| 5,268,635 | 12/1993 | Bortolini et al. | 324/96 |
| 5,371,352 | 12/1994 | Yoshida | 250/208.2 |
| 5,394,490 | 2/1995 | Kato et al. | 385/88 |
| 5,479,426 | 12/1995 | Nakanishi et al. | 372/43 |
| 5,617,036 | 4/1997 | Roff | 324/760 |
| 5,684,902 | 11/1997 | Tada | 385/88 |
| 5,694,048 | 12/1997 | Boudreau et al. | 324/752 |
| 5,719,979 | 2/1998 | Furuyama | 385/89 |

FOREIGN PATENT DOCUMENTS 0 208 977 A1  1/1987  European Pat. Off. ........ G01R 31/28

OTHER PUBLICATIONS

L. Balliet and S. B. Greenspan, Low Cost Fiber–Optic Connector With Integral Staking, IBM Corp. 1981, vol. 24, No. 3, pp. 1624–1626.

IEEE Transactions on Components, Hybrids and Manufacturing Technology; "Gigabit Transmitter Array Modules on Silicon Waferboard"; Craig A. Armiento; vol. 15; No. 6; Dec. 1992., pp. 1072–1080.

"1995 Proceedings 45ᵗʰ Electronic Components & Technology Conference–May 21–May 24, 1995"; pp. 841–845.

Patent Abstracts of Japan, Japanese Patent Application No. JP6053552, Publication Date, Feb. 25, 1994, Application No. JP920225121, Application date, Jul. 30, 1902. vol. 18 No. 280.

Electronics Letters; "Self–Aligned Flat–Pack Fibre–Photodiode Coupling"; Jul. 1988; vol. 24; No. 15.

U.S. Patent Application No. 60/010,929, Docket No. 16473L, Filed Jan. 31, 1996, Entitled: A Method of Manufacture of Passive Alignment Pedestals and Standoffs for Optical Systems.

(List continued on next page.)

*Primary Examiner*—Hung N. Ngo

[57] ABSTRACT

The present invention relates to a novel technique for mounting and packaging a passively aligned optical fiber to an optoelectronic device on a silicon optical bench. The silicon optical bench is thereafter mounted on a flat portion of a substantially cylindrical ferrule, preferably ceramic, and an optical fiber protruding from the cylindrical ferrule to the flat portion of the ferrule. The ferrule is toleranced to form either a single mode or multimode connection for the assembly. Thereafter, a substantially cylindrical housing tube is disposed over the assembly, the housing tube being enclosed on one side by the ceramic ferrule. An integral lead assembly, having an overmolded substantially cylindrical plug and electrical leads closes the housing tube on the opposite side of the housing tube from the ferrule. This lead assembly as stated is overmolded and has electrical leads which make contact with electrical leads disposed on the flat portion of the ceramic ferrule.

9 Claims, 2 Drawing Sheets

OTHER PUBLICATIONS

U.S. Patent Application No. 08/808,299, Docket No. 16458, Filed Feb. 28, 1996, which is based on Provisional Application No. 60/012,463, filed Feb. 28, 1996, Entitled: Packaging for Optoelectronic Device.

U.S. Patent Application No. 08/771,593 Docket No. 16452, Filed Dec. 20, 1996, (now abandoned) which is based on Provisional Application No. 60/009,142, filed Dec. 22, 1995, Entitled: Micromachined Silicon Structures for Single Mode Passive Alignment.

U.S. Patent Application No. 08/379,778, Docket No. 16105, Filed Jan. 27, 1995, (Allowed) Entitled: "Anodic Aluminum Oxide Passive Alignment Structures".

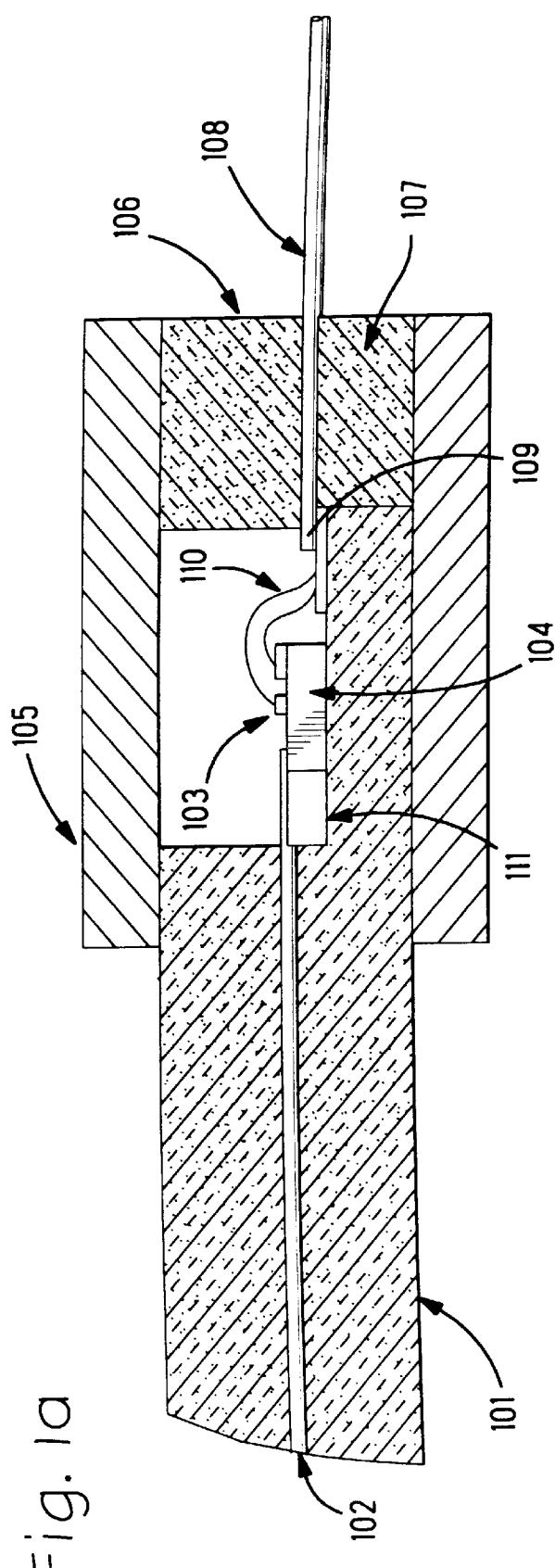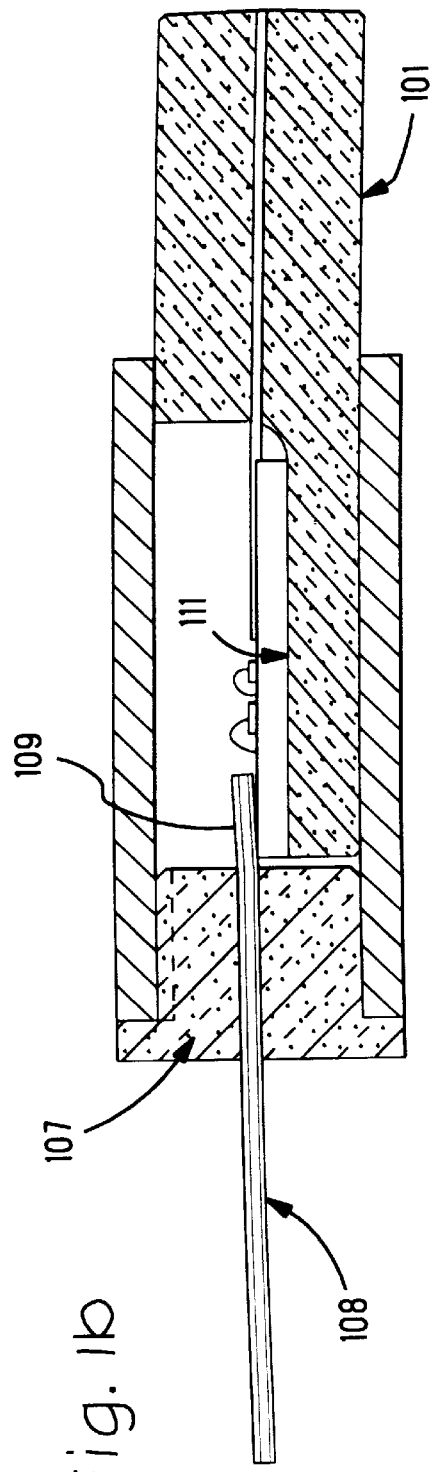

PACKAGE FOR AN OPTOELECTRONIC DEVICE

This application is a division of application Ser. No. 08/665,072 filed Jun. 11, 1996, now U.S. Pat. No. 5,692,084. This application claims benefit of Provisional application Ser. No. 60/012,531 filed Feb. 29, 1996.

FIELD OF THE INVENTION

The present invention relates to a package for an optoelectronic device mounted on a silicon optical bench and a fiber ferrule having a platform for mounting the silicon optical bench.

BACKGROUND OF THE INVENTION

In the realm of optoelectronics, packaging has become a crucial factor in the ability to manufacture reliable optoelectronic devices and systems. Passive alignment of a device and the subsequent packaging of the device is critical in assuring the ability to mass produce devices and systems as well as to manufacture systems and devices as at as low cost as is possible. Of course, the packaging and passive alignment of devices and systems requires a great deal of precision in order to meet the required performance characteristic. To this end, while active alignment and packaging of devices offers precision in the alignment of the device and subsequent packaging, the attendant costs in packaging, as well as the inability to produce a large quantity of devices and systems has lead to the need for a package which is precisely aligned in a passive manner.

One area of technology which holds great promise in the realm of packaging optoelectronic devices and the passive alignment of both active and passive devices in an optoelectronic system is silicon waferboard technology. In silicon waferboard technology, monocrystalline materials are used to effect the passively alignment with great precision. The use of silicon waferboard enables precision passive alignment through the use of well known and precisely defined monocrystalline planes of a monocrystalline material, to effect the passive alignment of the devices in the system. One example of a subassembly for an optoelectronic device is as found in U.S. Pat. No. 4,897,711 to Blonder et al, the disclosure of which is specifically incorporated herein by reference. The reference to Blonder et al has a silicon bench on which there is formed a v-groove for the placement of an optical fiber and a selectively disposed reflective surface etched in the silicon for alignment of the optical beam to and from a fiber to a detector or from a transmitter depending on the application. This silicon bench alignment structure enables the passive alignment of the device to the fiber. Thereafter the silicon bench is disposed on a dual in line package having a lead frame mounted thereon. Finally, a cover member is disposed to encase the packaged assembly.

As can be appreciated from a study of the above reference to Blonder, et al, there is a great deal of complexity in the fabrication of the design. While the reference to Blonder does disclose some advantages in packaging gained through the passive alignment of the optical fiber to the device, there are disadvantages to such a structure as well. These disadvantages are primarily manifest in a complexity in assembly, as well as in the potential mismatch of differing materials of the subassembly which can impact greatly the performance of the device. First of all, the silicon waferboard subassembly of the invention to Blonder et al rest on a metal lead frame which is further disposed in the dual in line package as is shown in FIG. 1 of the above-referenced patent. The various parts of this assembly as disclosed in the Blonder et al reference to include the dual in line package header, lead frame and cover are generally of differing material compositions. Accordingly, each material will have different thermal expansion and contraction properties. In such a system, there is a relatively large distance between the entrance of the optical fiber to the package and the point of interaction between the fiber endface and the device. When the device heats and cools, the various members will expand and contract in differing degrees resulting in strains and stresses on the optical fiber and thereby potential misalignment of the fiber to the device. Furthermore, the assembly of such a package has attendant complexities which will increase the overall complexity of the fabrication of the packaged assembly. The optical fiber is fixed in two locations, first at the substrate preferably silicon waferboard, and at the package wall. It is therefore required to put a slight bend in the fiber to isolate the stress in the fiber from the package wall. This results in complex assembly of the final product. Additionally, alignment is done only once the package is committed to the assembly. If the alignment is poor, the package is lost along with the component, resulting in increased cost of fabrication and a reduced yield. Finally, the assembly as disclosed in the reference to Blonder et al, is a pigtailed assembly. What is required is an assembly readily amendable being disposed in connector form while utilizing the attendant advantages of passive alignment as described supra and infra.

Accordingly, what is desired is a less complex assembly for mounting the optical subassembly on a single material and in a smaller package thereby reducing the costs of not only the material, but also the complexity of the fabrication and thereby the cost of the assembly, while maximizing operating performance. There is also the need to retain the required performance through passive alignment techniques. What is needed is a package for an optoelectronic device disposed on a silicon optical bench which is thereafter mounted on a mounting structure of a single material, thereby reducing potential misalignment due to thermal mismatch of materials. Furthermore, what is needed is a shortened distance from the point of entry into the package to the point of mounting on the silicon optical bench thereby reducing the stress on the fiber due to potential thermal mismatch that can occur between various elements of the package due to the thermal mismatch of the various materials.

SUMMARY OF THE INVENTION

The present invention relates to a novel technique for mounting and packaging a passively aligned optical fiber to an optoelectronic device on a silicon optical bench. The silicon optical bench is thereafter mounted on a flat portion of a substantially cylindrical ferrule, preferably ceramic, and an optical fiber protruding from the cylindrical ferrule to the flat portion of the ferrule. The ferrule is toleranced to form either a single mode or multimode connection for the assembly. Thereafter, a substantially cylindrical housing tube is disposed over the assembly, the housing tube being enclosed on one side by the ceramic ferrule. An integral lead assembly, having an overmolded substantially cylindrical plug and electrical leads closes the housing tube on the opposite side of the housing tube from the ferrule. This lead assembly as stated is overmolded and has electrical leads which make contact with electrical leads disposed on the flat portion of the ceramic ferrule. The assembly as is described in the present disclosure is anticipated for use in either a datalink or an active device mount, either metal or plastic, to complete the final optical assembly. A split sleeve is used for single mode applications, while a precision bore which is either molded or cut is used for multimode applications. The ferrule 101 forms the connector alignment surface in the connectorized application of the present invention. In this way, optoelectronic devices can be packaged in a relatively small, simple and nearly co-linear structure while retaining the benefits of passive alignment without the drawbacks of high costs due to complex parts or assembly techniques.

OBJECTS, FEATURES, AND ADVANTAGES

It is an object of the present invention to have a passively aligned optoelectronic package having high performance characteristics and manufactured at a low cost.

It is a feature of the present invention to have a single material ferrule having an optical fiber disposed therein and a flat portion ground on said ferrule for mounting a passively aligned silicon optical bench structure.

It is a further feature of the present invention to have an integrally formed lead assembly disposed in one end of a housing tube and the ceramic ferrule disposed in the other end of the housing tube to effect a simple package for the optoelectronic device.

It is an advantage of the present invention to have a passively aligned structure for an optoelectronic subassembly in which thermal mismatch does not inhibit the alignment of the optical fiber to the optoelectronic device.

It is a further advantage of the present invention to have an end product which is small in size by virtue of integration of the active components and the fiber connector.

BRIEF DESCRIPTION OF THE DRAWINGS

FIGS. 1*a* and 1*b* are cross-sectional views of the present invention having the ceramic ferrule mounted in one side of the housing tube in the lead assembly having integral plug mounted in the other end of the housing tube.

DETAILED DESCRIPTION OF THE INVENTION

Figure 2:
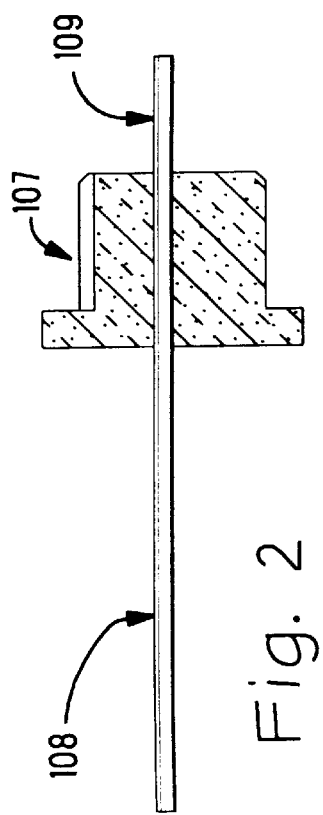
FIG. 2 is top view of the lead assembly and plug member of the lead assembly.
Figure 3:
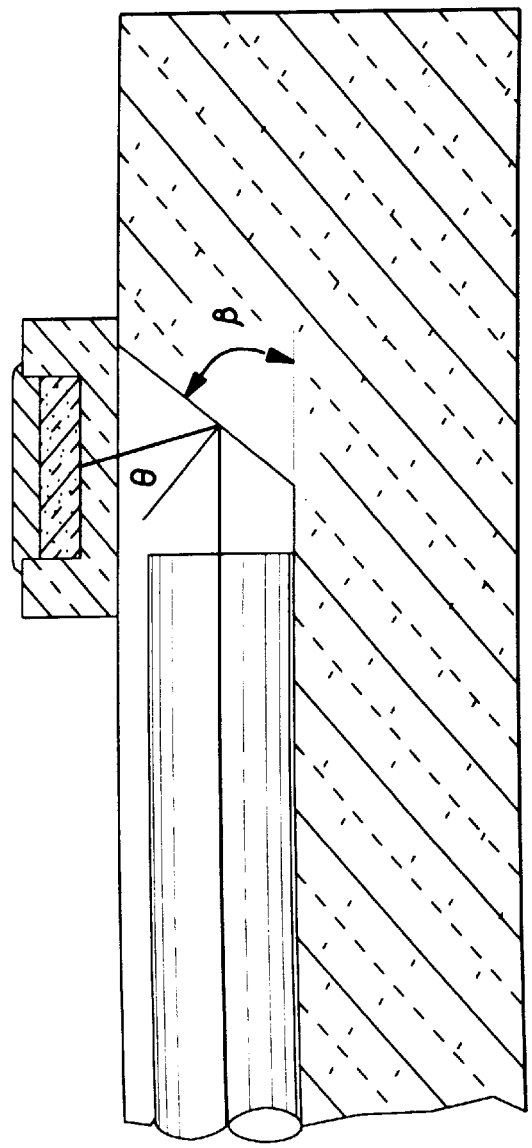
FIG. 3 is a cross sectional view of a typical silicon optical bench having an optoelectronic device passively aligned to an optical fiber.

Turning to FIG. 1 a ceramic ferrule 101 is shown having an optical fiber 102 mounted therein. The outer diameter of the ferrule forms the basis for optical alignment of the assembly to an optical fiber by the use of a split sleeve, precision bore or other common fiber connection techniques. The ceramic ferrule 101 has been ground to have a substantially flat portion 111 on which is disposed a silicon optical bench 104 having optoelectronic 103 mounted thereon. The ferrule member 101 is preferably made of a ceramic material, although other materials include metal and plastic. Thereafter a housing tube member 105 made of glass, metal, or plastic is disposed so as to be closed at one end by the ceramic ferrule. At the other end of the housing tube member a lead assembly 106 is disposed in the opening of the housing tube. This lead assembly has an integral plug 107 which is overmolded on electrical leads 108 on one end for connection to electronics, not shown. On the other end, lead members 109 are disposed to make the electrical connection directly to the optoelectronic devices mounted on the silicon substrate. This electrical connection between the optoelectronic devices 103 is by way of wire bonds 110 which make a connection to electrical contacts disposed on either the flat portion of the ceramic ferrule or to contacts on the optical bench. The overmolded portion of the plug 107 is shaped to enable a secure closure of the housing tube while exposing the electrical leads 109 for electrical contact to the electrical leads on the flat of the ceramic ferrule or to contacts directly on the optical bench 104 as in FIG. 1*b*.

The optical bench 104 is preferably a monocrystalline material such as a silicon. Silicon optical bench subassemblies as are disclosed in U.S. Pat. Nos. 5,694,048, 5,617,036, and patent application Ser. No. 60/004,505, the disclosures of which are specifically incorporated by reference, will suffice for the subassembly 104. Such subassemblies can be used for the transmission of light from an optoelectronic transmitter, for example and LED or a laser, as well as for the reception of light from an optical fiber by way of a photodiode, such as a PIN photodetector. The optical fiber is passively aligned to the silicon optical bench by techniques as disclosed in the above-referenced patent applications. As can be appreciated, in the transmission of light from an optical transmitter such as a laser or an LED, it is often required to monitor the output of the optoelectronic transmitter. To this end a monitor detector as is disclosed in U.S. Pat. No. 5,694,048 functions in this manner.

While the silicon optical bench technology using a monocrystalline material is the preferred optical bench for the present invention, it is clear that the optical bench is not the invention of the present disclosure. Accordingly, other subassemblies, optical benches, for passive alignment of an optical fiber to an optoelectronic device, as well as the passive alignment of active devices to one another and the passive alignment of active devices to passive devices on the optical bench, while less preferred are considered within the purview of the present invention. The major differences between the silicon optical bench of the preferred embodiment and those less preferred in the present invention lies in the material used as the substrate for the optical bench. To this end, amorphous materials, such as silica, or polycrystalline materials are possible. Passive alignment using such amorphous and polycrystalline materials can be found in U.S. patent application Ser. No. 08/379,778, and Provisional Applications 60/009,142, 60/012,463, 60/010,929 the disclosures of which are specifically incorporated herein by reference.

The plug assembly as is shown in FIG. 2, has conductive leads 108 for electrical connection to electronic devices (not shown), as well as electrical leads 109 for electrical connection to electrical contacts on the flat portion of the ceramic ferrule, or silicon waferboard. The plug assembly has an integral plug member 107 which is overmolded plastic, overmolded on the electrically conductive leads 108 and 109. This overmolding is effected by standard technique. The plug can be molded into the shape required for the assembly in the preferred embodiment of the present invention. Furthermore if desired, although less preferred, a substantially cylindrical plug can be molded.

The assembly of the various parts to properly align the various elements of the package is as follows. First the fiber is passively aligned to the substrate, preferable silicon waferboard 104 and fixed via epoxy or solder as desired thereafter, the fiber is cut to shorten the length to form a bare stub. The aligned assembly is placed in the ferrule by placing epoxy on the fiber stub and either epoxy or solder paste on the backside of the substrate 104. Thereafter, the fiber is inserted into the bore of the ferrule and the silicon waferboard substrate is placed on the flat surface of the ferrule and adhesively fixed. The housing tube is then placed over the ferrule and fixed by epoxy, solder or even by press fit if desired. The lead plug is placed into the tube so that the electrical contact is made with the flat surface of the plug and the flat surface of the ferrule via the contacts on these respective parts. Finally, the ferrule is polished with either PC or APC polish as is well known to the ordinary skilled artisan.

As stated above, the present invention has the attendant advantages of passive alignment of an optical fiber to an optoelectronic device through a silicon optical bench. The package of the present invention enables a simple design with few parts for packaging the device. Furthermore, a major advantage of the present invention lies in the fact that the silicon optical bench is disposed on the flat surface of a ferrule which contains the optical fiber. Accordingly, the silicon optical bench rests on the same material as that which houses the optical fiber, thereby reducing concerns of thermal mismatch of materials as the packaged device heats and cools during operation, which can adversely impact the alignment of the device to the fiber. Additionally, the structures of the present invention minimizes the distance between the fiber holder (ferrule) and the v-groove in which the fiber is mounted in the subassembly thereby reducing the concerns of thermal mismatch of materials' affect an alignment of the fiber. Furthermore, the simplicity of the design enables a very low cost assembly and package for an optoelectronic system without sacrificing the performance of the device in the package.

The invention having been described, it is clear that certain modifications and variations of the ferrule having a flat portion on which is mounted an optical bench with a passively aligned optical fiber to an optoelectronic device are possible to one of ordinary skill in the art. Furthermore, the use of a housing tube in which the ferrule is disposed on one side and a lead assembly having a plug member is mounted in the other side of the housing tube to effect the package is also subject to modification to the ordinary skilled artisan. To this end use of other materials as well as other subassemblies is considered within the purview of the ordinary skilled artisan. These obvious modifications and variations are within the theme and spirit of the invention are considered within the scope of the invention.

I claim:

1. A package for an optoelectronic device having a substrate having an optical fiber disposed therein and an optoelectronic device disposed thereon said optoelectronic device and said fiber passively aligned; a mounting surface on which said substrate is disposed and a cover substantially surrounding said mounting surface and said substrate, characterized in that:

said optical fiber is disposed in a ferrule, and said mounting surface is integrally formed on said ferrule.

2. A package for an optoelectronic device as recited in claim 1 wherein said cover is a substantially tubular member.

3. A package for an optoelectronic device as recited in claim 1 further characterized in that first electrical leads make electrical contact with second electrical leads disposed on said substrate, and said electrical leads are retained in a plug member.

4. A package for an optoelectronic device as recited in claim 3 wherein said ferrule is disposed in a first opening in said tubular housing member and said plug member is disposed in a second opening of said tubular housing member.

5. A package for an optoelectronic device as recited in claim 4 wherein said ferrule, said tubular housing member, and said plug member are oriented in a substantially co-linear fashion.

6. A package for an optoelectronic device, comprising:

a substrate having an optical fiber disposed therein and an optoelectronic device disposed thereon, said optical fiber and said optoelectronic device in optical communication with one another; a ceramic ferrule having said optical fiber disposed therein, said ceramic ferrule having at one end a flat surface on which said substrate is disposed; a plug member having electrical leads, said electrical leads integrally formed in said plug member and in electrical communication with electrical contacts on said substrate; and a substantially tubular housing member, having a first end in which said ceramic ferrule is disposed and a second end in which said plug member is disposed.

7. A package for an optoelectronic device as recited in claim 6 wherein said substrate is a monocrystalline material having a selectively located groove for said optical fiber.

8. A package for an optoelectronic device as recited in claim 6 wherein said package is further disposed in a connector housing for optical applications.

9. A package for an optoelectronic device as recited in claim 6 wherein said package is disposed in a datalink for optical applications.

* * * * *